(12) United States Patent
Arques

(10) Patent No.: US 7,362,175 B2
(45) Date of Patent: Apr. 22, 2008

(54) LOW-CONSUMPTION VOLTAGE AMPLIFIER

(75) Inventor: Marc Arques, Grenoble (FR)

(73) Assignee: Commissariat a l'Energie Atomique, Paris (FR)

(*) Notice: Subject to any disclaimer, the term of this patent is extended or adjusted under 35 U.S.C. 154(b) by 96 days.

(21) Appl. No.: 10/563,597

(22) PCT Filed: Jul. 13, 2004

(86) PCT No.: PCT/FR2004/050330

§ 371 (c)(1),
(2), (4) Date: Jan. 6, 2006

(87) PCT Pub. No.: WO2005/011104

PCT Pub. Date: Feb. 3, 2005

(65) Prior Publication Data

US 2006/0186959 A1    Aug. 24, 2006

(30) Foreign Application Priority Data

Jul. 17, 2003   (FR) .................................. 03 50344

(51) Int. Cl.
*H03F 3/18* (2006.01)
(52) U.S. Cl. ..................................................... 330/264
(58) Field of Classification Search ................. 330/264, 330/267
See application file for complete search history.

(56) References Cited

U.S. PATENT DOCUMENTS 3,733,514 A    5/1973   Garuts ........................ 315/388
6,750,716 B2 *  6/2004  Cusinato et al. ............ 330/260

FOREIGN PATENT DOCUMENTS

| EP | 0480815  | 4/1992 |
|----|----------|--------|
| EP | 0789450  | 8/1997 |
| WO | 03/034593 | 4/2003 |

* cited by examiner

*Primary Examiner*—Steven J. Mottola
(74) *Attorney, Agent, or Firm*—Oblon, Spivak, McClelland, Maier & Neustadt, P.C.

(57) ABSTRACT

A low consumption voltage amplifier including a transistor, a first current generator that supplies power to the drain of the transistor, a second current generator that charges the source of the transistor, the current output by the second current generator being substantially equal to the value of the current output by the first current generator, a first capacitor connected to the drain of the transistor, and a second capacitor connected to the source of the transistor. An additional field effect transistor of the type opposite to the type of the first field effect transistor is inserted between the current generator and the first field effect transistor.

15 Claims, 16 Drawing Sheets

LOW-CONSUMPTION VOLTAGE AMPLIFIER

TECHNICAL DOMAIN AND PRIOR ART

The invention relates to a low consumption voltage amplifier.

The low consumption voltage amplifier according to the invention may be used in any electronics domain. According to one particularly advantageous embodiment, the low consumption voltage amplifier according to the invention is a voltage/voltage amplifier of an X photon or gamma detector.

The block diagram for an X photon or gamma detector operating in photon counting is shown in FIG. 1. The detector comprises an elementary detector 1 polarized by a voltage Vpol, that transforms each detected photon into a current pulse, a charge/voltage amplifier A that integrates the current output by the elementary detector during the pulse duration and transforms the charge obtained into a voltage, a voltage/voltage amplifier 5 that amplifies the signal output by the charge/voltage amplifier and limits the bandwidth of this signal in order to reduce the detector noise, a comparator 6 that compares the voltage output by the amplifier 5 with a voltage threshold Vth and a counter 7.

The amplifier A is usually composed of an operational amplifier 2 for which the inverter input (−) is connected to the elementary detector 1 and for which the non-inverter input (+) is connected to the circuit ground, a resistor 3 and a capacitor 4 being mounted in parallel between the inverter input (−) and the output from the operational amplifier 2.

In general, the voltage/voltage amplifier 5 is expected to have the following performances:
capable of processing fast pulse flows (for example several million pulses per second);
low noise;
low consumption;
high input impedance (so that the output from the charge/voltage amplifier on the input side that has a high impedance can be input into it);
can be made as an integrated circuit so that it is compact;
adaptable to the at-rest voltage of the charge/voltage amplifier on the input side, that is not necessarily well established due to variations in the at-rest current of the elementary detector or technological dispersions.

FIG. 2 shows a voltage/voltage amplifier 5 according to prior art. The amplifier comprises a MOS transistor T (MOS for "Metal Oxide Semiconductor"), a first capacitor with capacitance Ca with a first armature connected to the gate of the transistor T, a second capacitor with capacitance Cb installed between the gate and the drain of the transistor T, a resistor r mounted in parallel with the second capacitor with capacitance Cb and a current generator i mounted between a power supply voltage Vdd and the drain of the transistor T for which the source is connected to the ground. The amplifier input E is composed of the second armature of the first capacitor with capacitance Ca and the output S from the amplifier through the drain of the transistor T. The nominal gain G of the amplifier is then written:

$$G = -Ca/Cb$$

The resistor r firstly stabilises the potential on the gate of the transistor T, and secondly varies the low cutoff frequency of the circuit.

Such an amplifier has several limitations. In particular, the counter-reaction (r, Cb) is such that in AC, the gate of the transistor T is like a virtual ground for the stage on the input side. The search for a high gain, and therefore a high capacitance Ca, then leads to charging the stage on the input side, and therefore introduces a significant consumption into this stage on the input side. The amplifier global consumption can then become high and can reach several tens of microwatts or even several hundreds of microwatts.

The amplifier according to the invention does not have this disadvantage.

PRESENTATION OF THE INVENTION

The invention relates to a voltage amplifier comprising a first field effect transistor with a gate, a drain and a source, the amplifier input terminal being the gate of the first field effect transistor, and the amplifier output terminal being the drain of this first field effect transistor. The voltage amplifier comprises:
a first current generator that charges the drain of the first transistor;
a second current generator that charges the source of the first transistor, the value of the current output by the second current generator being substantially equal to the value of the current output by the first current generator;
a first capacitor with a first terminal connected to the drain of the first transistor and a second terminal connected to a first reference voltage;
a second capacitor with a first terminal connected to the source of the first transistor and a second terminal connected to a second reference voltage; and
an additional field effect transistor of the type opposite to the type of the first field effect transistor, the drain of the additional transistor being connected to the drain of the first field effect transistor, the gate of the additional transistor being connected to a voltage that may or may not be offset from the voltage applied to the gate of the first field effect transistor, the source of the additional field effect transistor being connected to the first current generator and to a first terminal of an additional capacitor, the second terminal of which is connected to a fixed voltage.

The first and second reference voltages may be the same value, for example the circuit reference voltage (ground).

According to another characteristic of the invention, the amplifier comprises a slaving circuit to control its output voltage.

According to yet another characteristic of the invention, the slaving circuit is composed of a resistor connected between the drain of the first transistor and a fixed voltage.

According to yet another characteristic of the invention, the slaving circuit is composed of a read circuit, the amplifier output voltage being applied to the input of this read circuit and the output of the read circuit outputting a control signal for the gate of a transistor that forms the first or the second current generator.

According to yet another characteristic of the invention, the amplifier comprises a low pass filter placed at the output from the read circuit to filter the control signal output by the read circuit.

According to yet another characteristic of the invention, the read circuit is a voltage follower.

According to yet another characteristic of the invention, the read circuit is a differential amplifier with two inputs, the amplifier output voltage being applied to a first input of the differential amplifier and a reference voltage being applied to the second input of the differential amplifier.

According to yet another characteristic of the invention, the read circuit is an amplifier that amplifies the variations of the amplifier output voltage compared with a reference voltage determined from an adjustment voltage.

According to yet another characteristic of the invention, the slaving circuit is composed of a MOS transistor mounted with common gate and the source of which is connected to the amplifier output.

According to a first embodiment of the invention, the gate of the first field effect transistor and the gate of the additional transistor are connected together.

According to a second embodiment of the invention, the amplifier comprises a voltage offset circuit to form the voltage applied to the gate of the additional transistor from the voltage applied to the gate of the first field effect transistor.

According to yet another characteristic of the invention, the voltage offset circuit is an external voltage source.

According to yet another characteristic of the invention, the voltage offset circuit is a directly polarised diode.

According to yet another characteristic of the invention, the amplifier is made using the MOS technology.

The invention also relates to an X photon or gamma detector comprising a charge/voltage amplifier and a voltage/voltage amplifier that amplifies the voltage output by the charge/voltage amplifier, characterised in that the voltage/voltage amplifier is an amplifier according to the invention.

BRIEF DESCRIPTION OF THE FIGURES

Other characteristics and advantages of the invention will appear after reading preferred embodiments of the invention with reference to the attached figures among which.

The same references denote the same elements in all figures.

DETAILED DESCRIPTION OF EMBODIMENTS OF THE INVENTION

Figure 1:
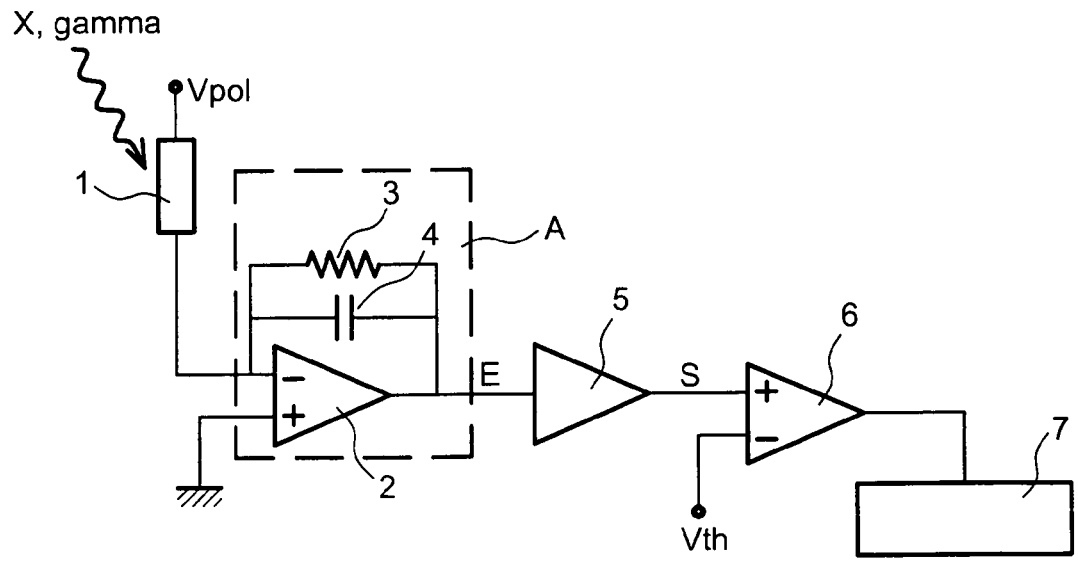
FIG. 1 shows a block diagram of an X photon or gamma detector according to prior art.
Figure 2:
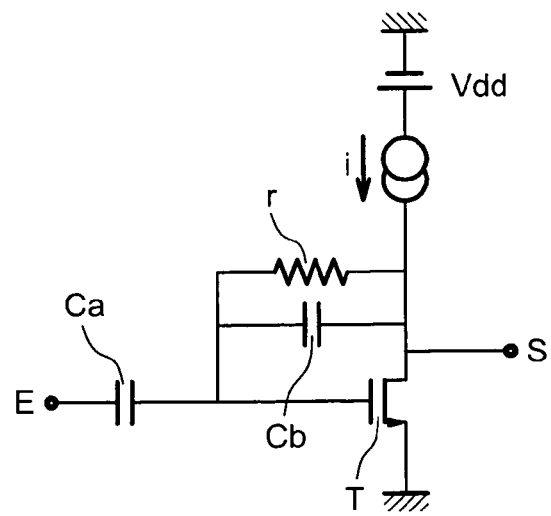
FIG. 2 shows an electrical diagram for a voltage/voltage amplifier of an X photon or gamma detector according to prior art.
Figure 3:
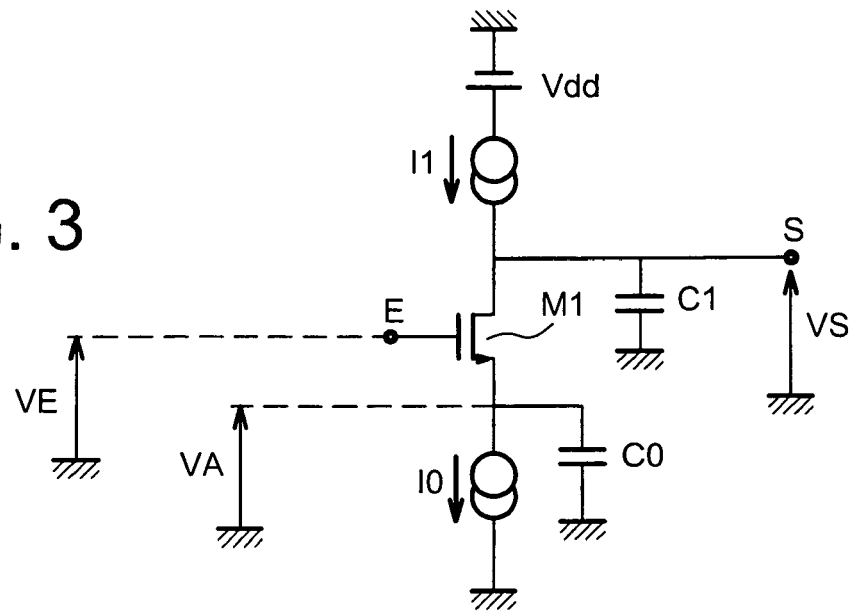
FIG. 3 shows an electrical diagram for a voltage/voltage amplifier.

FIG. 3 shows an electrical diagram of a voltage/voltage amplifier.

The voltage/voltage amplifier comprises a MOS transistor M1, a first current generator I1, a first capacitor with capacitance C1, a second current generator I0 and a second capacitor with capacitance C0. The circuit is described with an N type MOS transistor, as an example. A person skilled in the art could easily transpose this circuit for use with a P type MOS transistor.

The amplifier is then powered between a polarisation voltage Vdd and a reference voltage, for example the ground. The input terminal E and the output terminal S of the amplifier are the gate and the drain respectively of the transistor M1.

The transistor drain is connected to a first terminal of the first current generator I1, the second terminal of which is connected to the power supply voltage Vdd. The first capacitor with capacitance C1 has a first terminal connected to the drain of the transistor M1 and a second terminal connected to the ground. The source of transistor M1 is connected to a first terminal of the second current generator I0, and the second terminal of the second current generator is connected to the ground. The second capacitor with capacitance C0 is mounted in parallel with the second current generator I0.

We will now describe operation of the amplifier.

Initially, transistor M1 is not conducting.

The current generator I0 injects electrons onto the source of transistor M1, these electrons are stored in the capacitor with capacitance C0 leading to a drop in the source potential VA, until the transistor M1 starts conducting. The source potential VA stabilises when the current that passes through the transistor M1 becomes equal to I0. As long as the transistor M1 is not conducting, the amplifier output voltage VS is equal to the power supply voltage Vdd. As soon as the transistor M1 starts conducting current I0, and if the currents I1 and I0 are substantially equal, the sum of the currents applied to the output terminal S are equal to zero and the output voltage VS may a priori stabilise at any value between VE-VT and Vdd, where VE is the amplifier input voltage and VT is the threshold voltage of transistor M1.

Suppose that the output voltage VS is equal to an at-rest voltage VS0. If the amplifier input stage modulates the input voltage VE by a positive quantity ΔVE, then the transistor M1 is temporarily more conducting and the potential VA increases until the current passing through the transistor M1 stabilises once again at this value I0. We then have:

$$VA \approx VE - VT + \Delta VE.$$

The charge Q01 transmitted by the transistor M1 from the source to the drain of the transistor M1 throughout the duration Δt1 of the transient phenomenon described above is then written:

$$Q01 = -I0 \times \Delta t1 - C0 \times \Delta VE$$

Throughout this duration Δt1, the charge Q1 output by the current generator I1 onto the output terminal S is written:

$$Q1 = I1 \times \Delta t1, \text{ and}$$

$$Q1 \approx I0 \times \Delta t1$$

The charge variation $\Delta Q1$ on the output terminal S is then written:

$$\Delta Q1 \cong -C0 \times \Delta VE,$$

which generates a voltage variation such that:

$$\Delta VS \cong -(C0/C1) \times \Delta VE.$$

Thus the amplifier has a negative gain equal to $-(C0/C1)$, throughout the duration of the transient during which the voltage $\Delta VE$ appears. An input step is then transformed into an output step.

When the voltage VE returns to its at-rest state and therefore varies by a negative quantity $\Delta VE$, the transistor M1 is temporarily less conducting. The voltage VA then reduces until the current that passes through the transistor stabilises again at the value I0. The voltage VA is then written:

$$VA \cong VE - VT.$$

The charge Q02 transmitted by the transistor M1 from the source to the drain for the duration $\Delta t2$ of this transient phenomenon is then written:

$$Q02 = -I0 \times \Delta t2 + C0 \times \Delta VE$$

During this time $\Delta t2$, the charge Q2 output by the current generator I0 on the output terminal S is written:

$$Q2 = I1 \times \Delta t2, \text{ namely}$$

$$Q2 \cong I0 \times \Delta t2$$

Therefore the charge variation $\Delta Q2$ on terminal S is written as follows:

$$\Delta Q2 \cong C0 \times \Delta VE$$

which generates a voltage variation $\Delta Vs$ such that:

$$\Delta VS \cong (C0/C1) \times \Delta VE$$

Since this variation is the opposite of the above variation, the output voltage VS returns to its at-rest value.

The proposed voltage amplifier is a negative gain voltage amplifier $-(C0/C1)$.

The main advantages of such a circuit can be listed as follows:
- the charge received by the stage on the input side of the amplifier is only the small gate capacitance of transistor M1,
- if the at-rest value of the input voltage VE varies, this changes the equilibrium point of the source of transistor M1 (VA≈VE−VT), and consequently this changes the voltage excursion possible for the output voltage VS (from VA to Vdd), while this changes neither the at-rest value of the output voltage VS nor the gain of the circuit.

The voltage VS available at the amplifier output is output at high impedance. Therefore, this requires that the stage on the output side is a high impedance stage itself. This is easily possible due to the use of integrated circuits, particularly MOS integrated circuits for which the input impedance of the stage on the output side can be purely capacitive and high due to the small size of transistors (low gate capacitance). It should be noted also that the stray connection capacitance between the amplifier and the output side stage is added to the output capacitance C1. Once again, integrated circuits minimise stray capacitances.

It is desirable that currents I0 and I1 should be equalized as precisely as possible so that the voltage VS can stabilize between voltage VE−VT and voltage Vdd. Due to technological dispersions, it is generally impossible to achieve almost perfect equality between I0 and I1 simply by choosing the size of components from which the circuit is made. In this case, almost perfect equality between I0 and I1 is achieved using a slaving device.

FIGS. 4A, 4B, 5A and 5B represent different variants of an improved voltage/voltage amplifier.

Figure 4A:
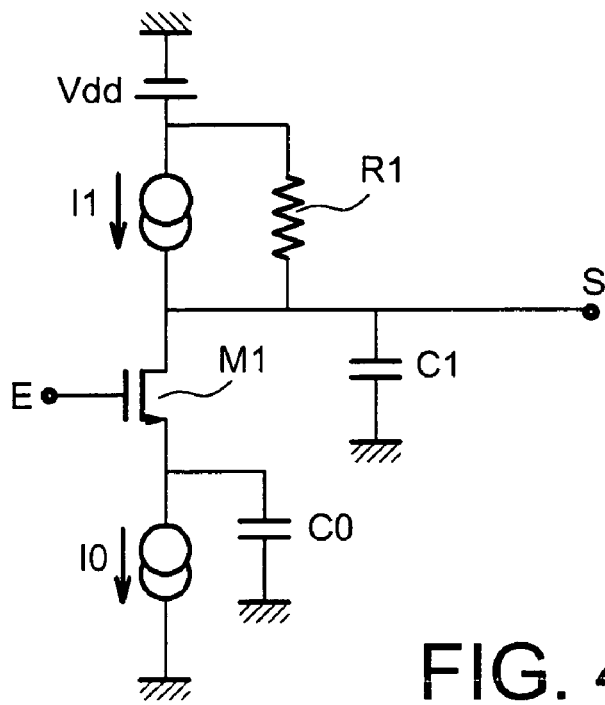
FIGS. 4A, 4B, 5A and 5B represent different variants of an improved voltage/voltage amplifier.

FIG. 4A shows a first variant of this first improvement.

According to this first variant, the amplifier comprises all the elements already described with reference to FIG. 3, and also includes a resistor R1. A first terminal of the resistor R1 is connected to the drain of transistor M1 and its second terminal is connected to the voltage Vdd. According to other embodiments, the second terminal of the resistor R1 may be connected to a fixed voltage different from voltage Vdd, for example the ground.

The assembly composed of the current source I1 and the resistor R1 is then an imperfect current source with nominal value I1, and with an output resistor R1. By construction, the value of the current I1 in this case is chosen to be less than I0. The voltage VS stabilises when the following relation is satisfied:

$$Vdd - VS = R1 \times (I0 - I1), \text{ namely}$$

$$VS = Vdd - R1 \times (I0 - I1)$$

In the case in which the second terminal of the resistor R1 is connected to the ground, by construction the current I1 is chosen to be greater than I0. The current circulating in the resistor R1 is then equal to I1−I0 and the equations that express the voltage VS are modified accordingly.

The circuit according to the first variant of the first improvement does not transport very low frequency variations of the input voltage VE. The output voltage then returns to its equilibrium point with the time constant R1C1. This is advantageous, because the X-ray or gamma detection circuit voltage amplifier is usually required to be band-pass («shaper»function).

Although the low cutoff frequency is defined by the time constant R1C1, the high cutoff frequency is defined by the transfer rate of charges from the capacitor with capacitance C0 to the capacitor with capacitance C1, in other words by the time constant $(1/g_m) \times C0$, where $g_m$ is the transconductance of the transistor M1, itself defined by the choice of the current I0.

The slaving amplifier shown in FIG. 4A regulates the current circulating in the resistor R1 such that the sum of the current I1 and the current passing through the resistor R1 is equal to I0.

Figure 4B:
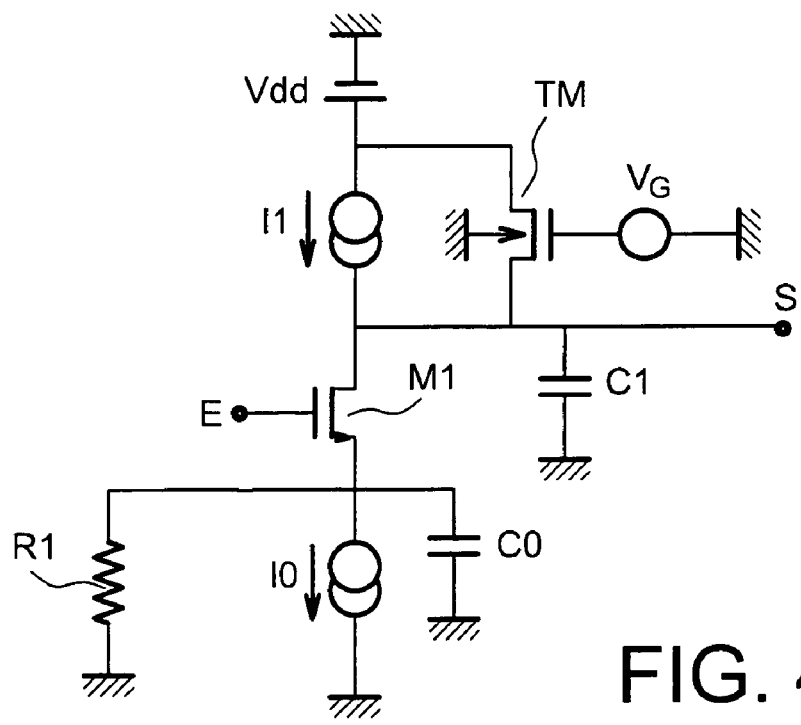

FIG. 4B shows a second variant of the first embodiment.

According to this second variant, the amplifier comprises all the elements already described with reference to FIG. 3, with also a MOS transistor TM mounted in common gate and for which the source is connected to the amplifier output. The gate of the transistor TM is then connected to a fixed voltage VG such that:

$$VG = VS - VTmos,$$

where VTmos is the threshold voltage of the transistor TM and VS is the amplifier output voltage.

The transistor TM operating under saturated conditions then has a highly non-linear behaviour as a function of the voltage VS. This circuit is particularly well adapted when the amplifier input signal is composed of pulses.

The transistor TM may be of the N type or the P type. In the case in which the transistor TM is of the N type (FIG. 4B), its drain is connected to the voltage Vdd and its substrate is connected to the ground. The current I1 is then less than the current I0 and the circuit is adapted to the presence of negative pulses at the amplifier input.

In the case in which the transistor TM is of the P type (not shown on the figures), its drain is connected to the ground and its substrate is connected to the voltage Vdd. In this case, the current I1 is greater than the current I0 and the circuit is adapted to the presence of positive pulses at the amplifier input.

Figure 5A:
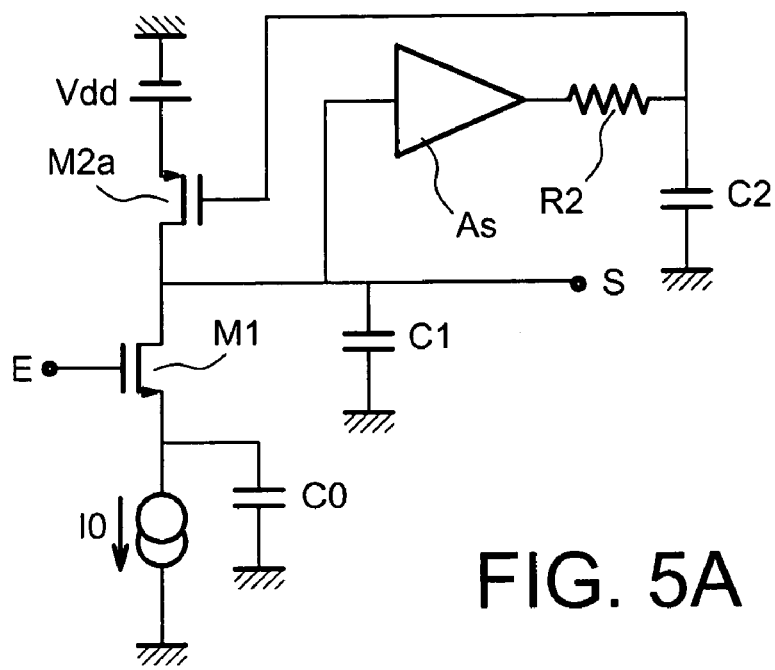
Figure 5B:
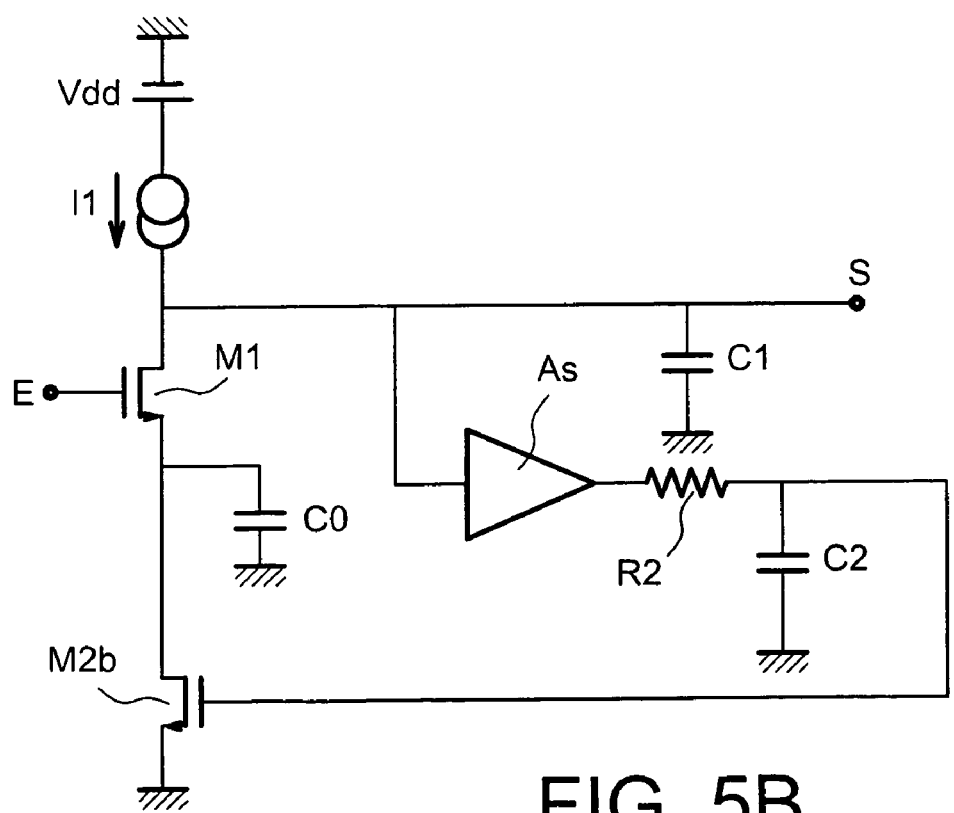

Two other variants to the first improvement of the slaving amplifier are shown in FIGS. 5A and 5B. Only the circuit shown in FIG. 5A is described, the circuit shown in FIG. 5B can be deduced easily from the circuit shown in FIG. 5A.

In the second example of a slaving voltage/voltage amplifier, the amplifier comprises all the elements already described with reference to FIG. 3, and also has a read circuit As and a low-pass filter composed of a resistor R2 in series with a capacitor with capacitance C2.

In this case the current generator I1 is made from a P type transistor M2$a$ for which the drain, source and gate are connected to the drain of transistor M1, to the power supply voltage Vdd and to the intermediate point between R2 and C2 respectively. The circuit input As is connected to the drains of transistors M1 and M2$a$ (i.e. the output S of the amplifier). A first terminal of the filter composed of the resistor R2 in series with the capacitor with capacitance C2 is connected to the output from the read circuit As, the second terminal of the filter, namely the intermediate point, being connected to the gate of transistor M2$a$.

The output voltage VS is read by the read circuit As that reproduces the variations of voltage VS with a positive but not necessarily constant gain, and with an offset voltage that is not necessarily zero. The output from the read circuit As is filtered at low frequency by the circuit (R2, C2). The filtered voltage is applied to the gate of transistor M2$a$.

The at-rest value of the voltage VS is the value that produces a voltage on the gate of transistor M2$a$, through the read circuit As, such that the current I1 that passes through the transistor M2$a$ is equal to the current I0.

The read circuit As may be made in different ways. Thus, the circuit As may be a voltage follower with a gain equal to substantially 1. The circuit As may also be a differential amplifier with two inputs, the voltage VS being applied to a first input and a reference voltage being applied to the second input. In the latter case, the output voltage VS stabilises at a value substantially equal to the reference voltage. A third example is the case in which the circuit As amplifies variations in the voltage VS with respect to a reference voltage determined from an adjustment voltage, as can be seen as an example in FIG. 9.

In order to achieve a stable circuit, the read circuit As is designed to introduce a small phase shift. The amplifier according to the two variants described with reference to FIGS. 5A et 5B does not transport DC. The low cutoff frequency is defined by the time constant R2C2. As before, the high cutoff frequency is defined by $(1/g_m) \times C0$.

According to the diagram in FIG. 5A, the current generator I0 is master and the current generator I1 is slaved. FIG. 5B shows the variant in which the current generator I1 is master and the current generator I0, made using the transistor M2$b$, is slaved.

Figure 6:
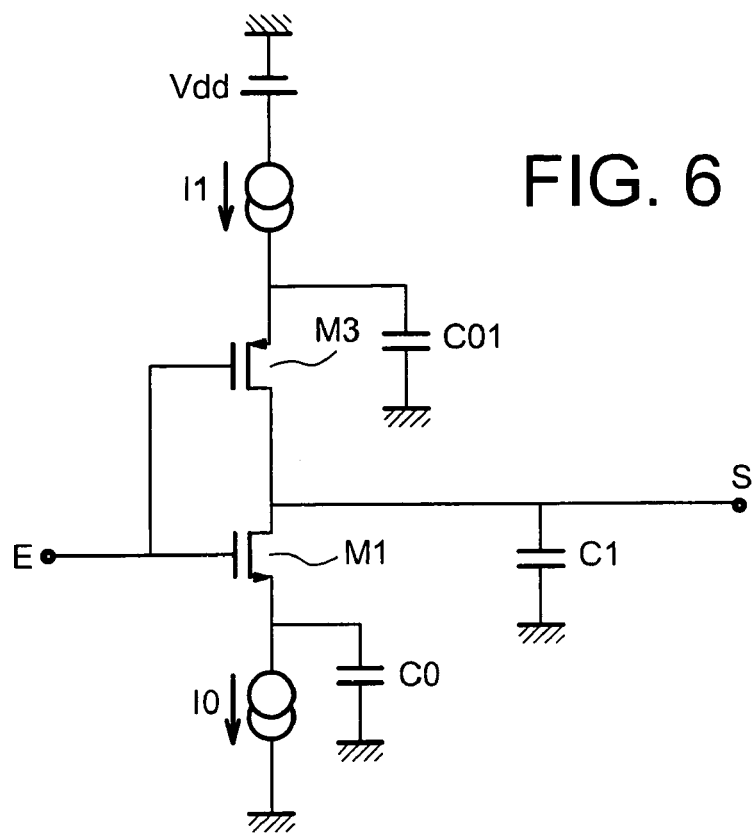
FIG. 6 shows a voltage/voltage amplifier according to a first embodiment of the invention.

FIG. 6 shows a voltage/voltage amplifier according to a first embodiment of the invention. The amplifier according to the invention comprises means of increasing the amplifier gain.

The voltage/voltage amplifier according to the invention comprises all the elements already described with reference to FIG. 3, and also a transistor M3 and a capacitor with capacitance C01. The transistor M3 is a P type MOS transistor mounted in series between the transistor M1 and the current generator I1, the drain, the source and the gate of transistor M3 being connected to the drain of transistor M1, to the current generator I1 and to the amplifier input E, respectively. Therefore, the amplifier input E is connected to the gates of transistors M1 and M3. A first terminal of the capacitor with capacitance C01 is connected to the source of transistor M3, and the second terminal is connected to the circuit ground.

In the same way as above, precise equality between currents I0 and I1 may be achieved by a slaving device as shown in FIGS. 10-19. The slaving device is then made, for example, by any one of the slaving devices described above (see FIGS. 4A-5B).

Transistors M1 and M3 are in saturated conditions. It follows that:

$VS > VE - VT(M1)$, and $VS < VE - VT(M2)$, where

VT(M1) is the threshold voltage (positive) of transistor M1 and VT(M2) is the threshold voltage (negative) of transistor M2. The role of the slaving device (not shown in FIG. 6) is to assure an at-rest value of the voltage VS that respects these two relations precisely.

When the input voltage VE increases, the current passing through transistor M1 increases and the current passing through transistor M3 reduces.

At the end of an input transient ΔVE, we get:

$\Delta VS = -(C0/C1 + C01/C1) \times \Delta VE$

Therefore advantageously, the amplifier gain is increased. For example, if the capacitances C0 and C01 are substantially equal, the gain is doubled while consumption remains unchanged.

Figure 7:
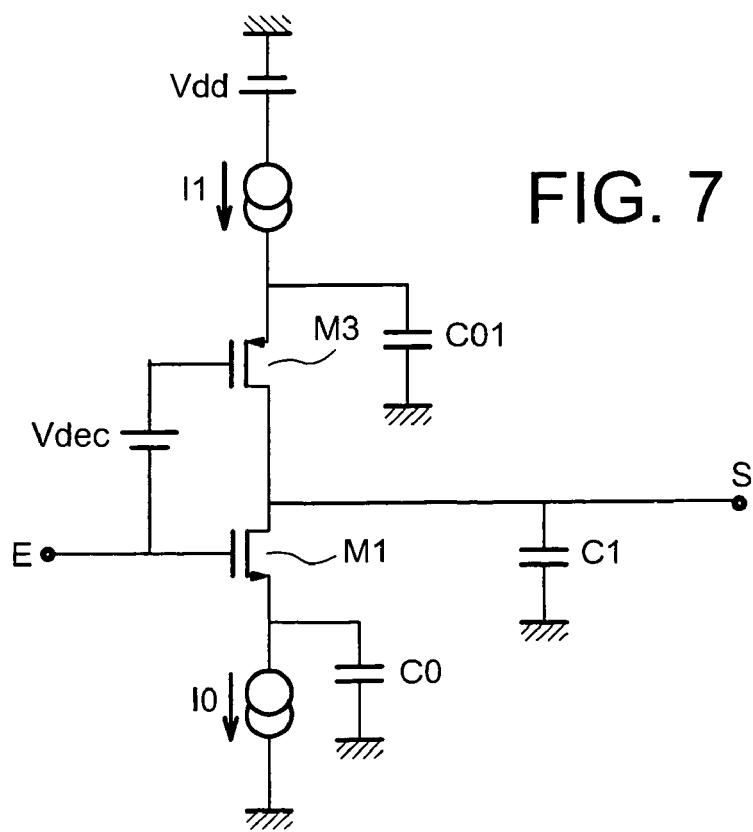
FIG. 7 shows a voltage/voltage amplifier according to a second embodiment of the invention.

A second embodiment of the invention is shown in FIG. 7. This other mode is preferably applicable to the case in which the input side stage simultaneously outputs an output voltage in the form of two different at-rest voltages. In the case in which the input side stage only outputs a single output voltage, it is obvious to a person skilled in the art that the voltage can be duplicated using an intermediate stage, for example using the voltage drop that occurs at the terminals of a directly polarised diode. The diagram in FIG. 7 symbolically illustrates duplication of the output voltage from the input-side stage in the form of an offset voltage Vdec applied between the gate of transistor M3 and the gate of transistor M1. The voltage VE is thus applied to the gate of transistor M1 and the voltage VE+Vdec is applied to the gate of transistor M3.

In the case in which the voltage Vdec is negative, the minimum value necessary for the power supply voltage Vdd is low and consequently it is possible to reduce the dissipated power (but in this case the voltage excursion VS is also low). Conversely, if the voltage Vdec is positive, the minimum value of the power supply voltage Vdd is increased and consequently it is possible to increase the excursion of voltage VS (but in this case the dissipated power is also increased).

It should be noted here that FIGS. 4A, 4B, 5A, 5B described above relate to improvements to voltage amplifiers according to prior art and that these improvements that consist of associating a slaving circuit to voltage amplifiers, also relate to the invention and therefore to the circuits shown in FIGS. 6 and 7. Voltage amplifiers according to the invention and provided with slaving circuits are not shown in the figures simply for reasons of clarity.

Figure 8:
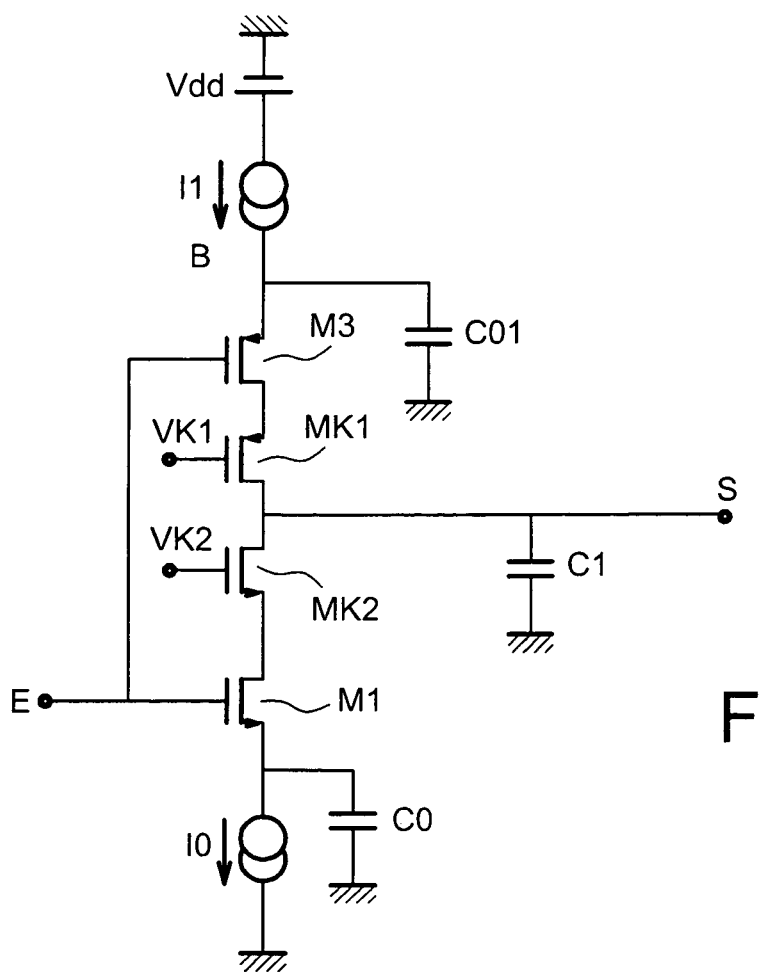
FIG. 8 shows an improvement to the voltage/voltage amplifier shown in FIG. 6.

FIG. 8 shows a variant of the embodiment shown in FIG. 6.

In addition to the elements shown in FIG. 6, the circuit in FIG. 8 comprises a cascode circuit composed of two transistors MK1 and MK2 of the P and N types respectively, mounted in series between transistors M3 and M1. The source of transistor MK1 is connected to the drain of transistor M3 and the source of transistor MK2 is connected to the drain of transistor M1. The drains of transistors MK1 and MK2 are connected together and form the output from the voltage amplifier. Voltages VK1 and VK2 applied to the gate of transistor MK1 and to the gate of transistor MK2 respectively are adjusted to achieve polarisation in cascode mode. One advantage of the circuit shown in FIG. 8 is to reduce the Miller capacitances of the circuit, and consequently to reduce the charge as seen by the stage on the input side.

The circuit shown in FIG. 8 is an example consisting of a cascode circuit with two transistors. The invention also relates to circuits for which the cascode circuit only comprises, for example, a single transistor.

Figure 9:
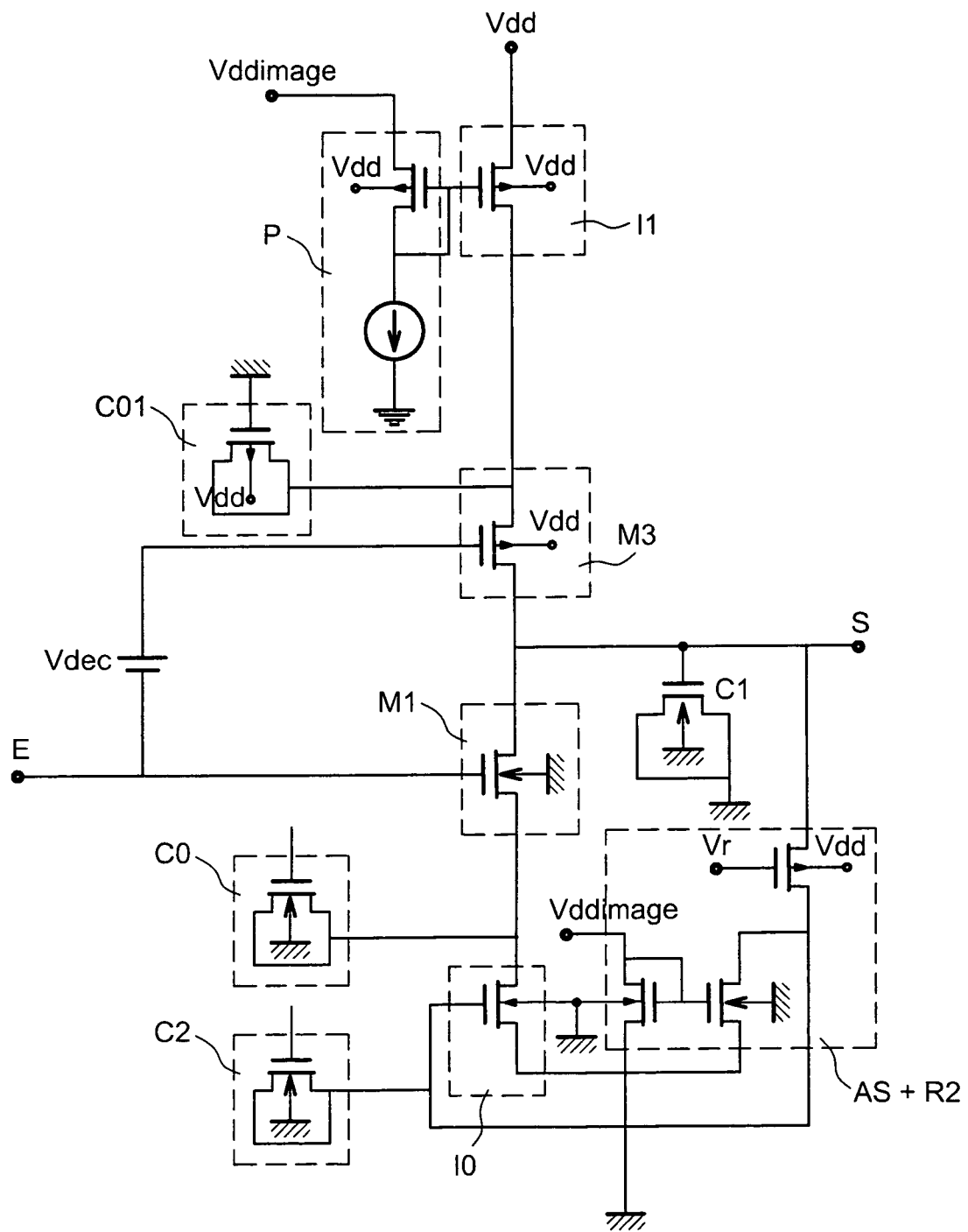
FIG. 9 shows an example embodiment of a voltage/voltage amplifier according to the invention.
Figure 10:
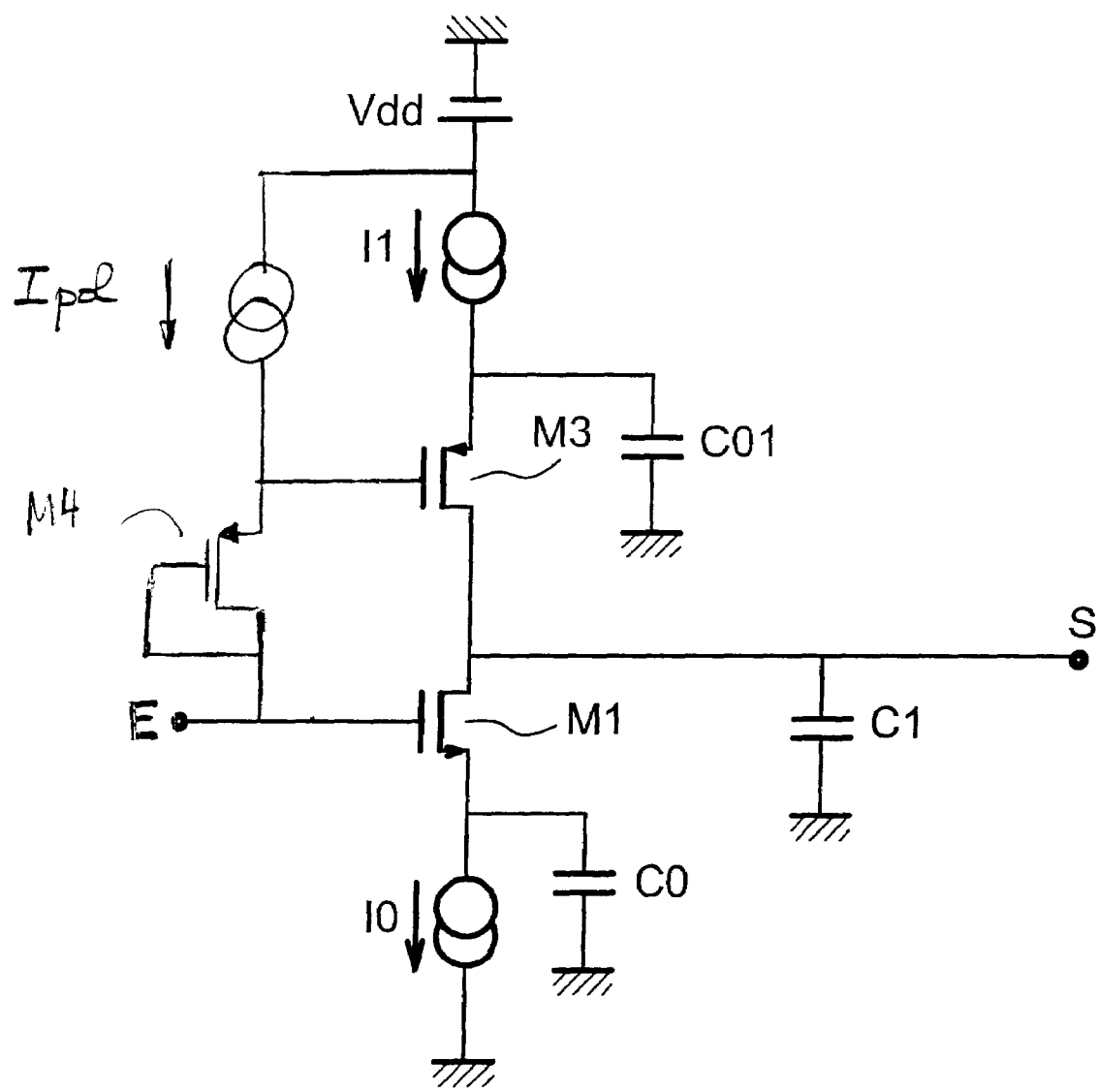
FIG. 10 shows a voltage/voltage amplifier according to a variation of the first embodiment of the invention.
Figure 11:
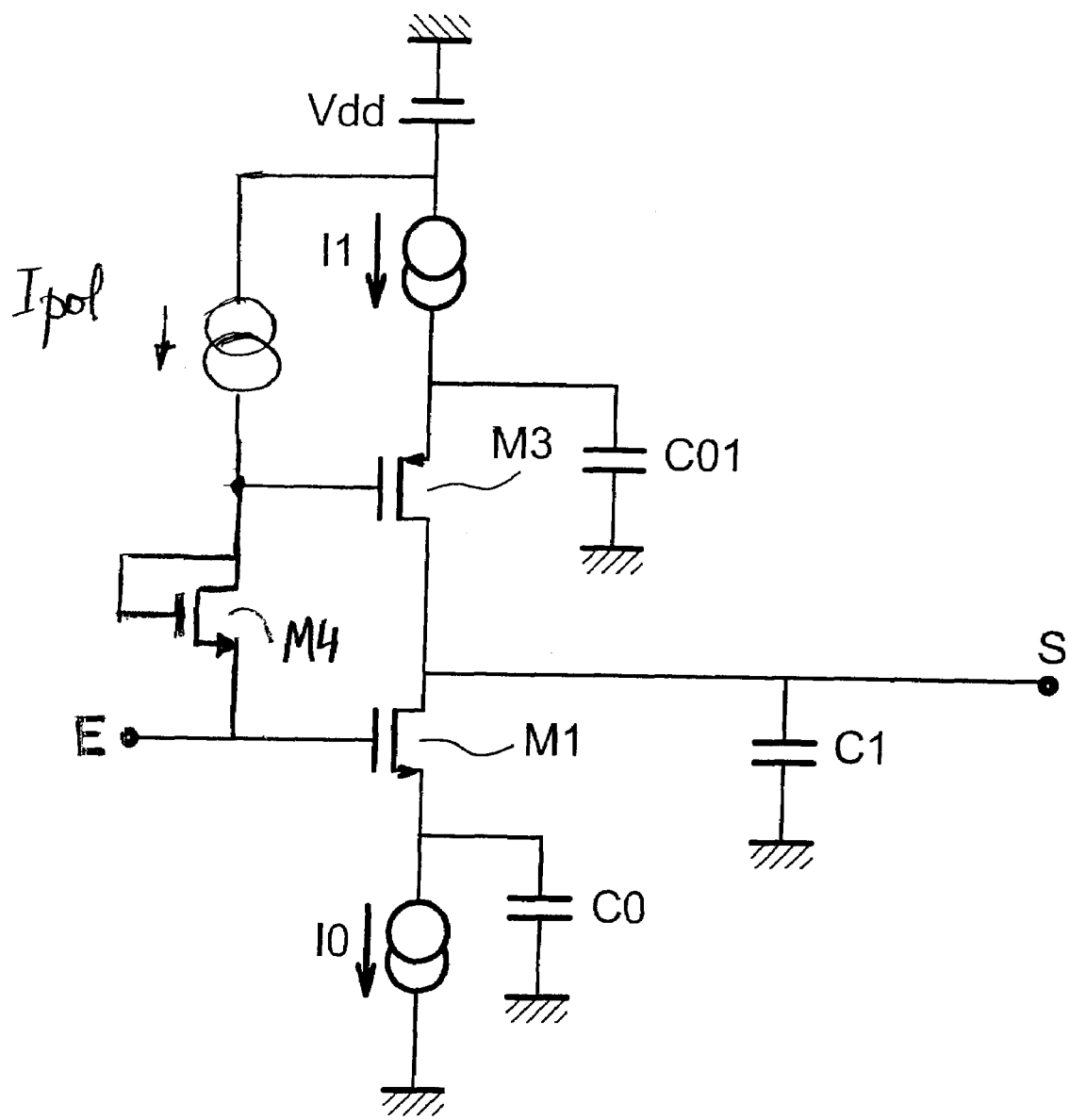
FIG. 11 shows a voltage/voltage amplifier according to a variation of the first embodiment of the invention.
Figure 12:
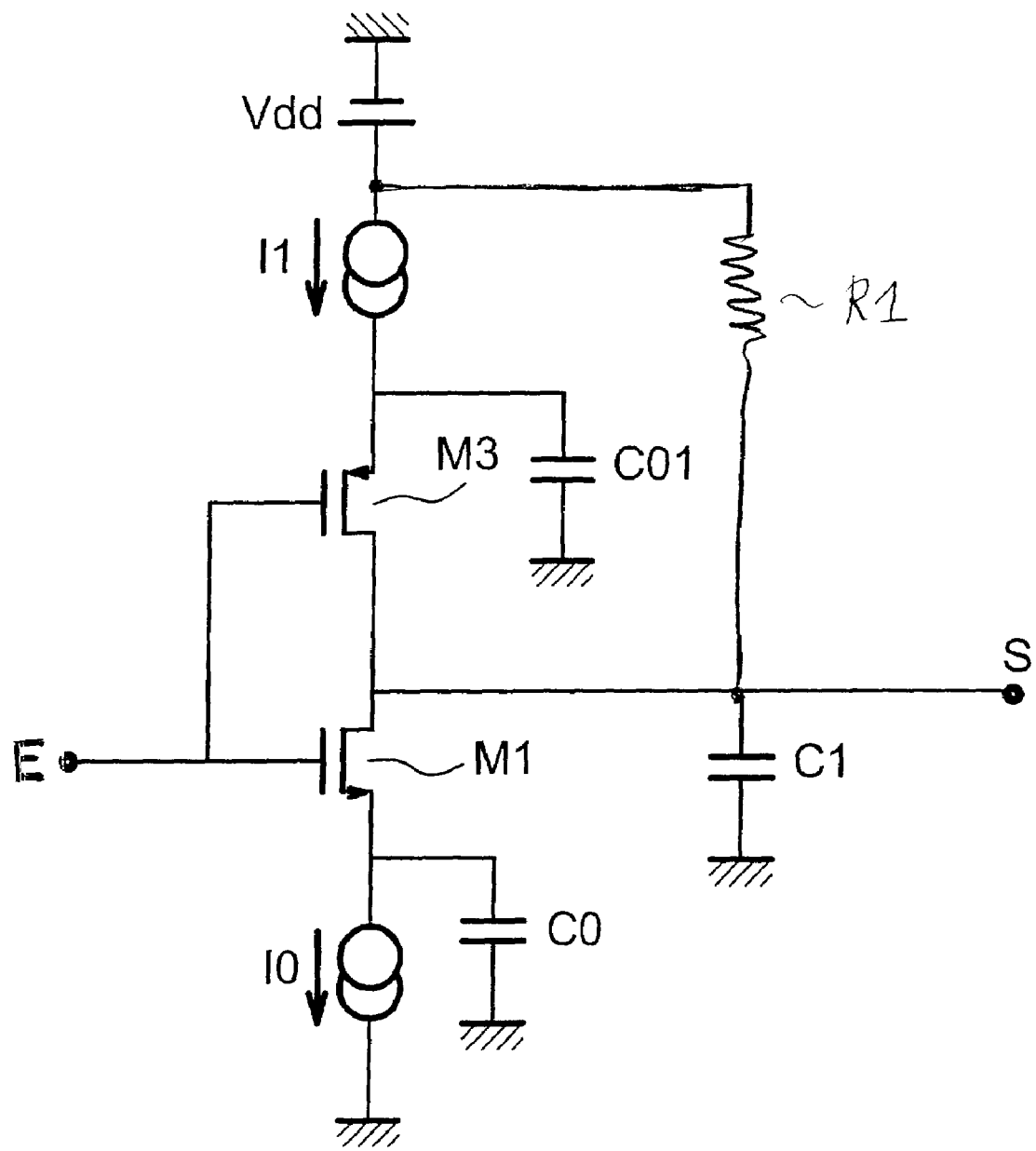
FIG. 12 shows a voltage/voltage amplifier according to a variation of the first embodiment of the invention.
Figure 13:
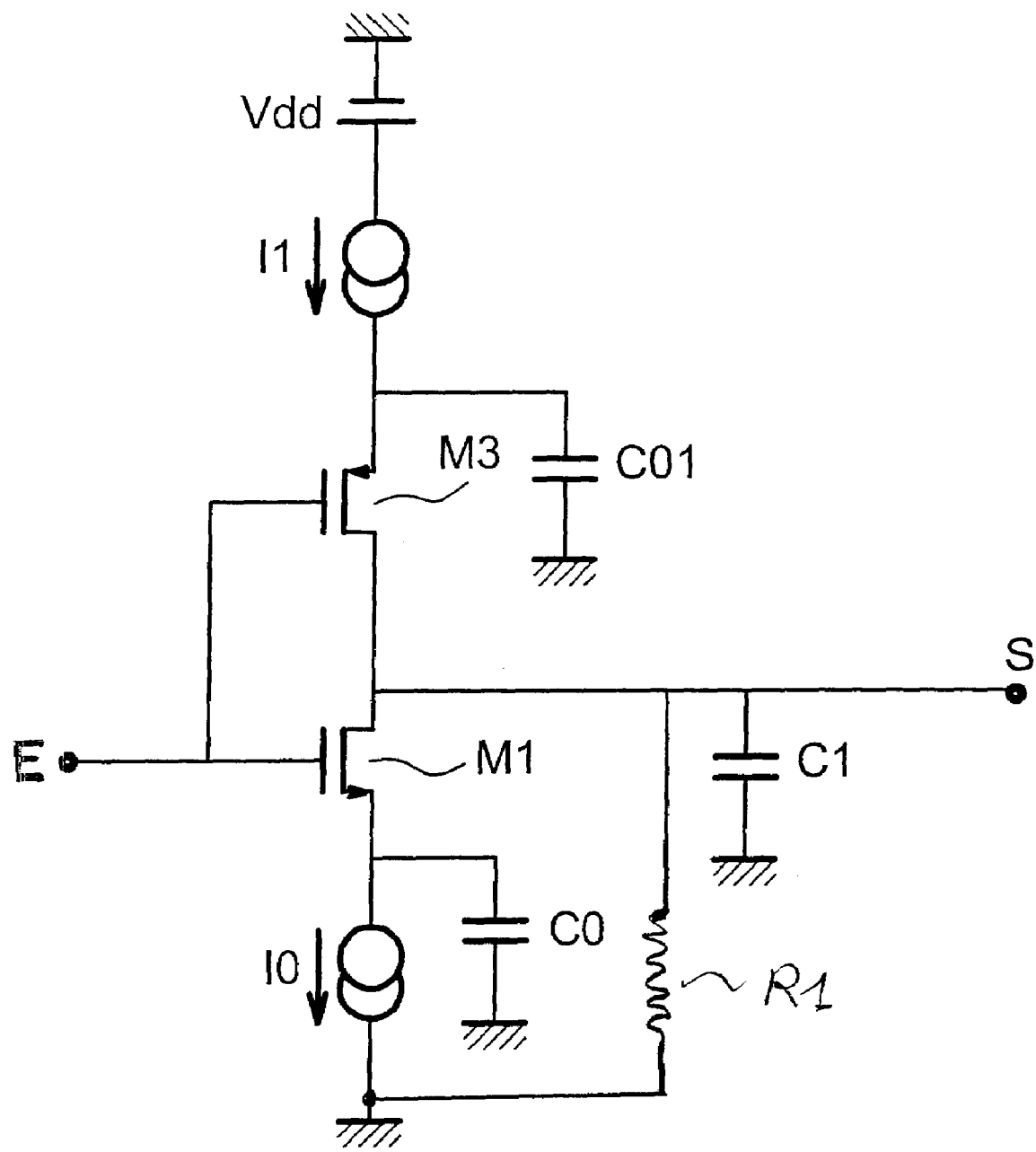
FIG. 13 shows a voltage/voltage amplifier according to a variation of the first embodiment of the invention.
Figure 14:
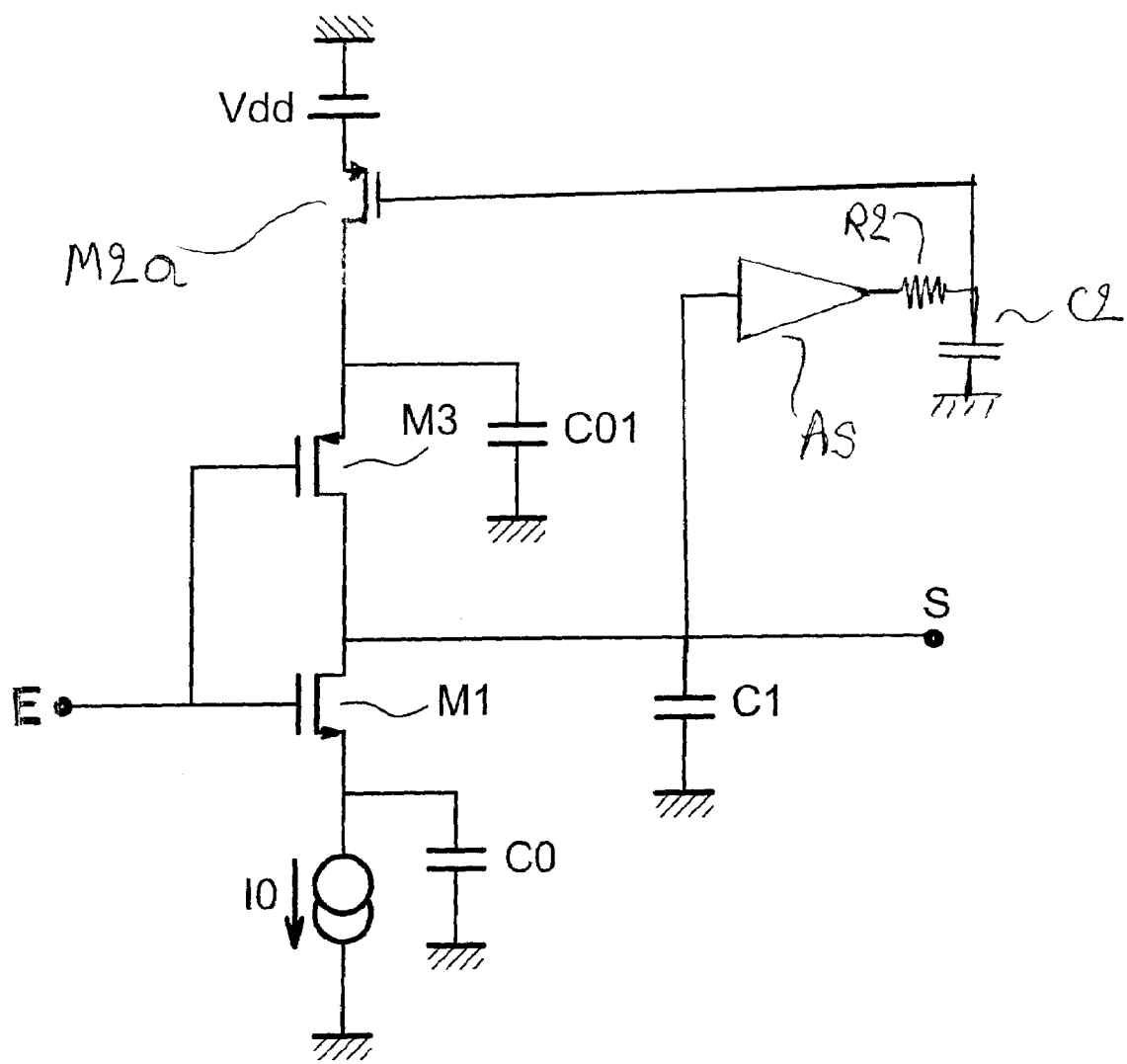
FIG. 14 shows a voltage/voltage amplifier according to a variation of the first embodiment of the invention.
Figure 15:
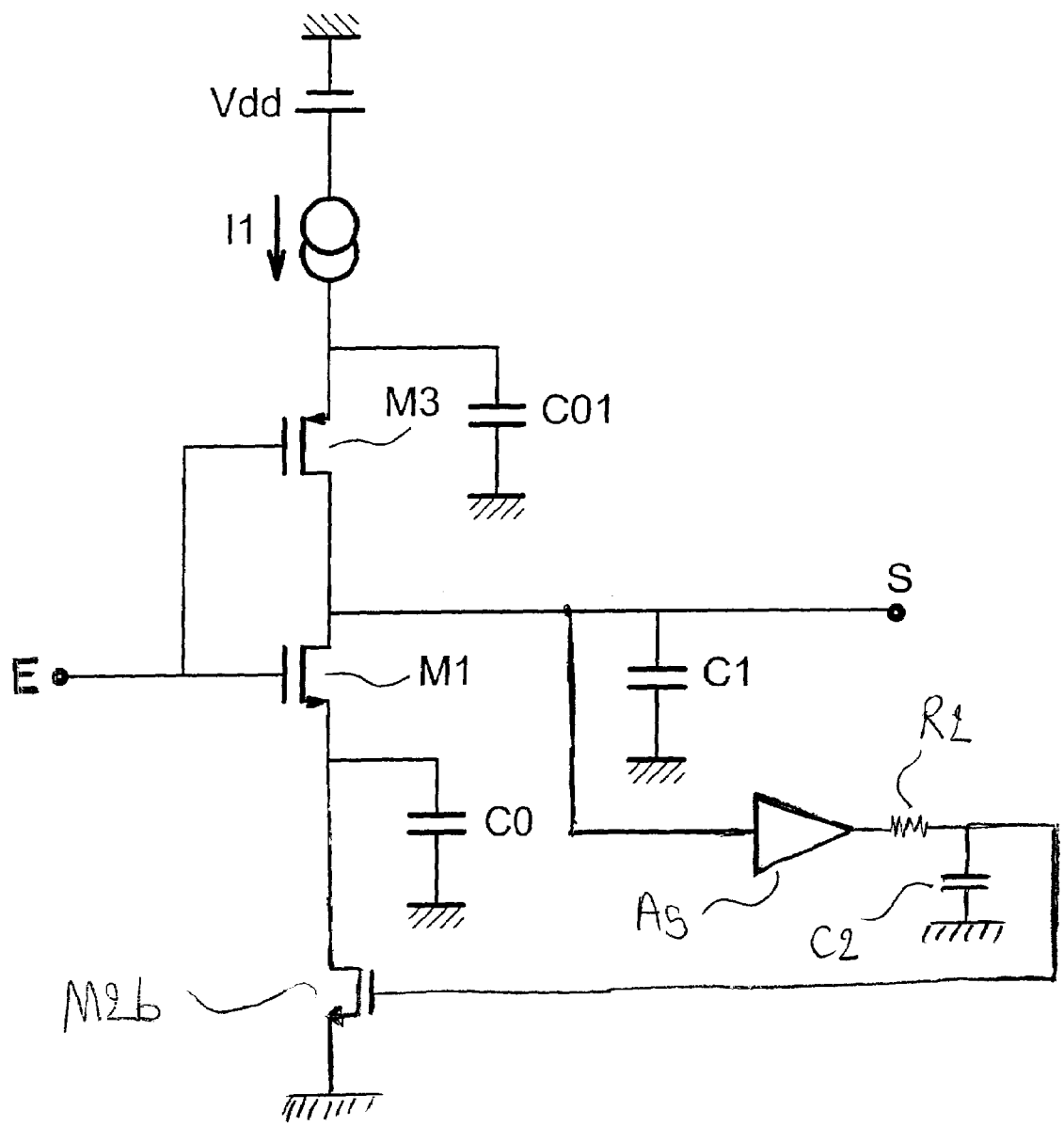
FIG. 15 shows a voltage/voltage amplifier according to a variation of the first embodiment of the invention.
Figure 16:
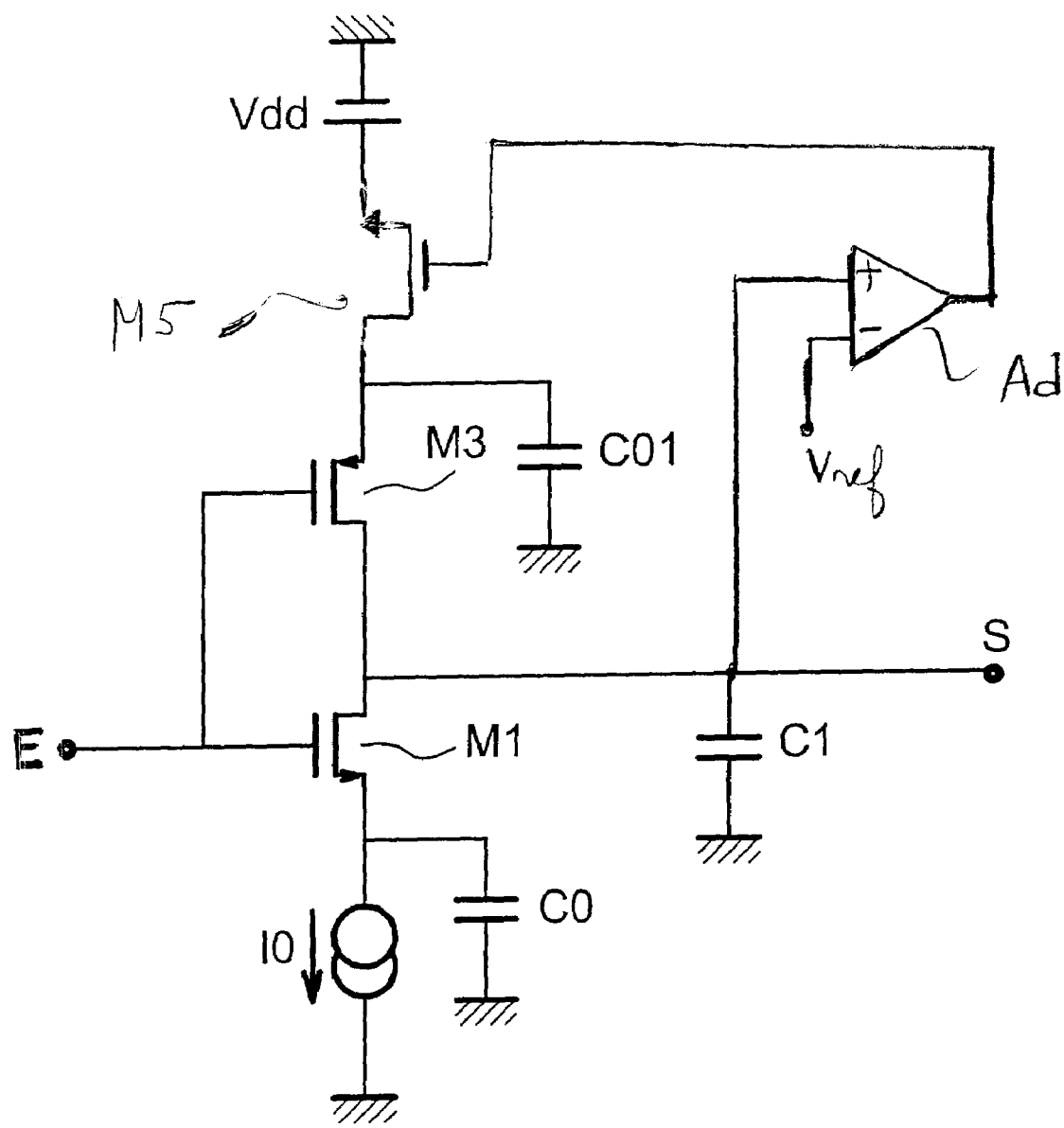
FIG. 16 shows a voltage/voltage amplifier according to a variation of the first embodiment of the invention.
Figure 17:
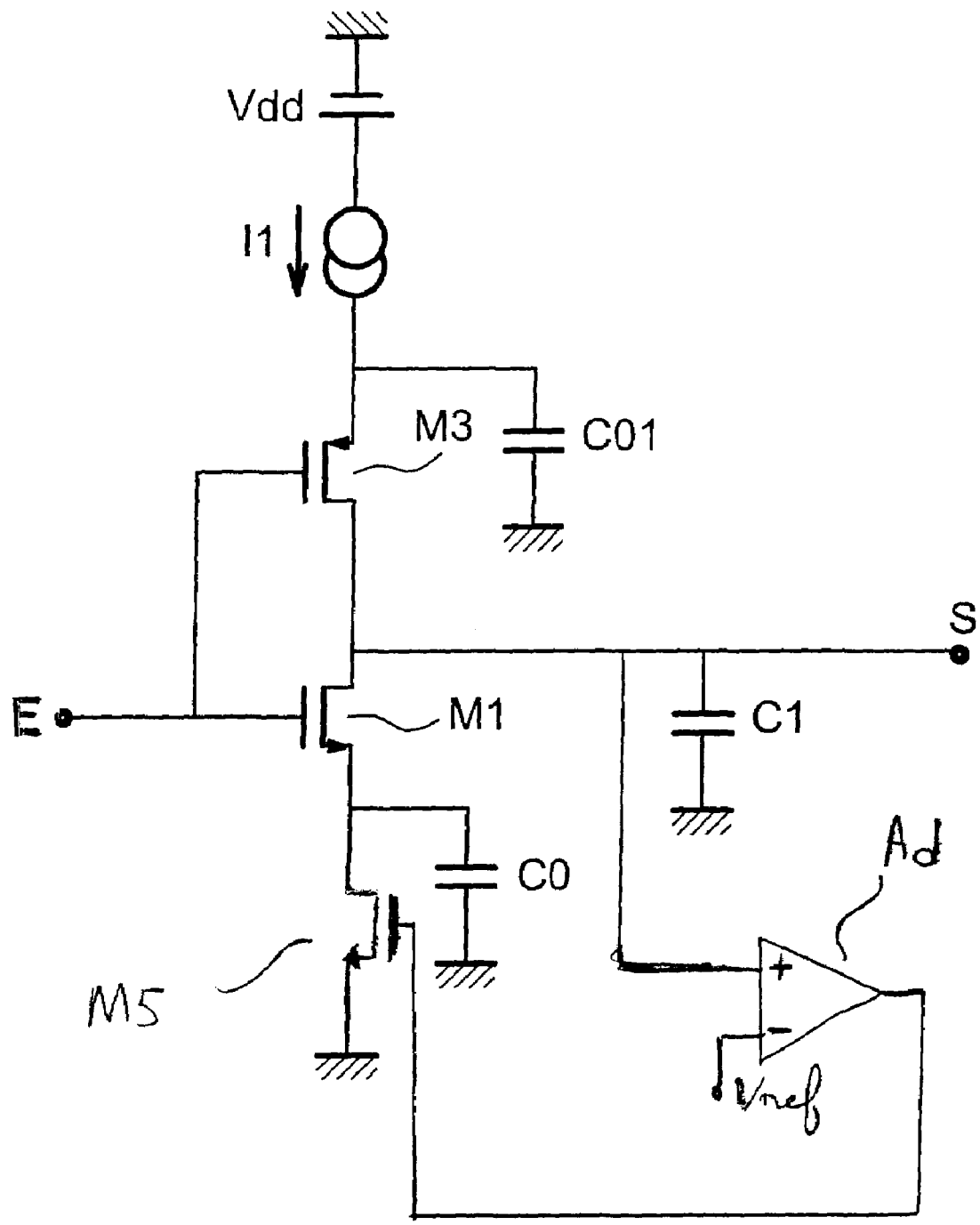
FIG. 17 shows a voltage/voltage amplifier according to a variation of the first embodiment of the invention.
Figure 18:
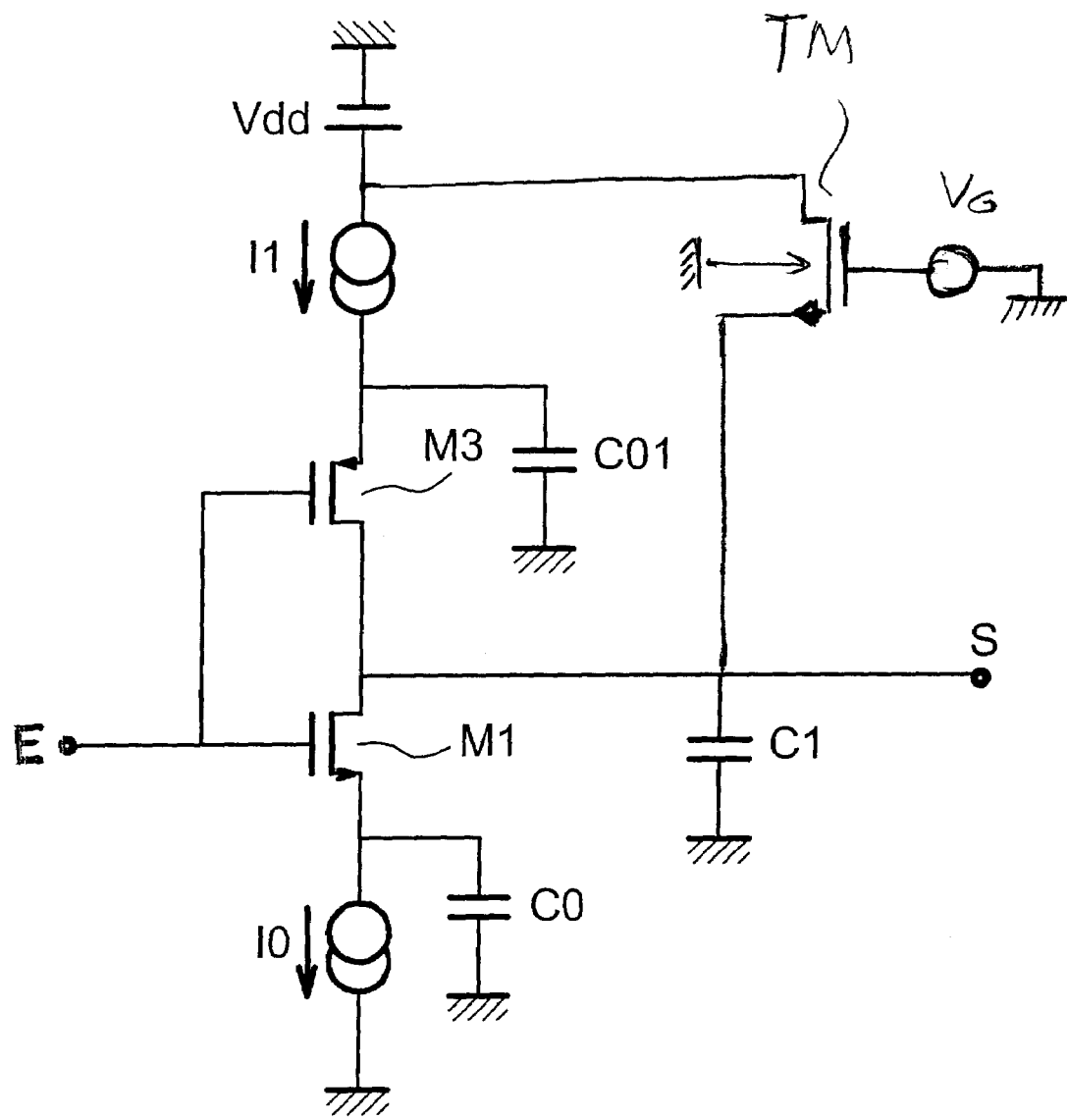
FIG. 18 shows a voltage/voltage amplifier according to a variation of the first embodiment of the invention.
Figure 19:
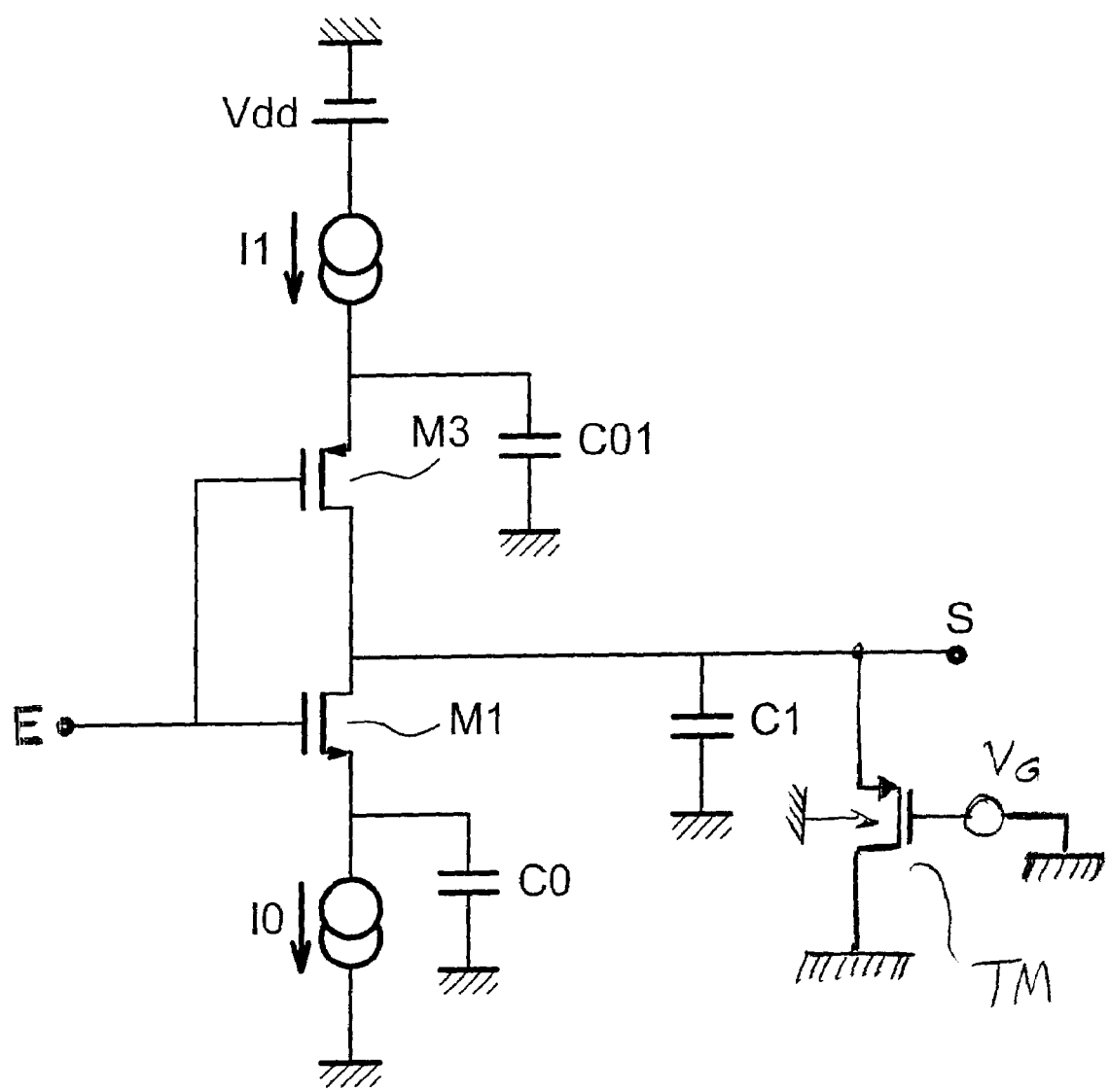
FIG. 19 shows a voltage/voltage amplifier according to a variation of the first embodiment of the invention.

FIG. 9 shows an electrical circuit made using the MOS technology illustrating an example embodiment of an amplifier according to the invention. The electrical circuit in FIG. 9 shows an amplifier for which the block diagram is as given in FIG. 7, and that comprises a slaving device like that shown in FIG. 5B. The electrical circuit shown in FIG. 9 thus comprises current generators I1 and I1, transistors M1 and M3, and capacitors with capacitances C0, C1, C01, C2, the read amplifier As and the resistor R2, all these components being made using MOS transistors. The circuit shown in FIG. 9 also comprises a bias circuit P for the transistor gate that forms the current generator I1. The bias circuit P is powered by a voltage Vddimage that is also the power supply voltage of the read amplifier As. The read amplifier As is conforming with the third example of a read amplifier mentioned above, and consequently amplifies variations in the output voltage VS with respect to a reference voltage determined from an adjustment voltage Vr.

The electrical circuit shown in FIG. 9 is designed to amplify with a negative gain positive voltage pulses applied to the input E with reference to an at-rest level of the input voltage.

The circuit is polarized between a voltage Vdd and the ground.

The invention claimed is:

1. A voltage amplifier comprising:
   a first field effect transistor with a gate, a drain, and a source, an amplifier input terminal being the gate of the first field effect transistor, and an amplifier output terminal being the drain of the first field effect transistor;
   a first current generator that charges the drain of the first transistor;
   a second current generator that charges the source of the first transistor, a value of the current output by the second current generator being substantially equal to a value of the current output by the first current generator;
   a first capacitor with a first terminal connected to the drain of the first transistor and a second terminal connected to a first reference voltage;
   a second capacitor with a first terminal connected to the source of the first transistor and a second terminal connected to a second reference voltage; and
   an additional field effect transistor with a gate, a drain, and a source, of a type opposite to a type of the first field effect transistor, the drain of the additional transistor being connected to the drain of the first field effect transistor, the gate of the additional transistor being connected to a voltage that is or is not offset from the voltage applied to the gate of the first field effect transistor, the source of the additional field effect transistor being connected to the first current generator and to a first terminal of an additional capacitor, the second terminal of the additional capacitor being connected to a fixed voltage.

2. An amplifier according to claim 1, wherein, when the gate of the additional transistor is connected to a voltage offset from the voltage applied to the gate of the first field effect transistor, the amplifier comprises a voltage offset circuit to form the voltage applied to the gate of the additional transistor from the voltage applied to the gate of the first field effect transistor.

3. An amplifier according to claim 2, wherein the voltage offset circuit is an external voltage source.

4. An amplifier according to claim 2, wherein the voltage offset circuit is a directly polarized diode.

5. An amplifier according to claim 1, wherein, when the gate of the additional transistor is connected to a voltage not offset from the voltage applied to the gate of the first field effect transistor, the gate of the additional transistor and the gate of the first field effect transistor are connected together.

6. An amplifier according to claim 1, further comprising a slaving circuit to control the amplifier output voltage.

7. An amplifier according to claim 6, wherein the slaving circuit includes a resistor connected between the drain of the first transistor and a fixed voltage.

8. An amplifier according to claim 6, wherein the slaving circuit includes a read circuit in which the amplifier output voltage is applied to the input of the read circuit, and a control signal is output by the read circuit to control the gate of a transistor that forms the first or the second current generator.

9. An amplifier according to claim 8, further comprising a low pass filter placed at an output from the read circuit to filter the control signal output by the read circuit.

10. An amplifier according to claim 8, wherein the read circuit includes a voltage follower.

11. An amplifier according to claim 8, wherein the read circuit includes a differential amplifier with first and second inputs, the amplifier output voltage being applied to the first input of the differential amplifier and a reference voltage being applied to the second input of the differential amplifier.

12. An amplifier according to claim 8, wherein the read circuit includes an amplifier that amplifies variations of the amplifier output voltage compared with a reference voltage determined from an adjustment voltage.

13. An amplifier according to claim 6, wherein the slaving circuit includes a MOS transistor mounted with a common gate and the source of which is connected to the amplifier output.

14. An amplifier according to claim 1, made using MOS technology.

15. X photon or gamma detector comprising a charge/voltage amplifier and a voltage/voltage amplifier that amplifies the voltage output by the charge/voltage amplifier, wherein the voltage/voltage amplifier is an amplifier according to claim 1.

* * * * *